(12) United States Patent
Huang

(10) Patent No.: US 12,315,797 B2
(45) Date of Patent: May 27, 2025

(54) SEMICONDUCTOR SUBSTRATE STRUCTURE AND METHOD OF MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/614,472

(22) Filed: Mar. 22, 2024

(65) Prior Publication Data
US 2024/0234298 A1 Jul. 11, 2024

Related U.S. Application Data

(63) Continuation of application No. 17/204,829, filed on Mar. 17, 2021, now Pat. No. 11,961,799.

(51) Int. Cl.
*H01L 23/522* (2006.01)
*H01L 21/768* (2006.01)
*H01L 23/00* (2006.01)

(52) U.S. Cl.
CPC .... *H01L 23/5226* (2013.01); *H01L 21/76802* (2013.01); *H01L 21/76877* (2013.01); *H01L 23/562* (2013.01)

(58) Field of Classification Search
CPC ........... H01L 23/5226; H01L 21/76802; H01L 21/76877; H01L 23/562; H01L 23/5384; H01L 2221/68345; H01L 21/56; H01L 21/6835; H01L 23/3121; H01L 23/5389
See application file for complete search history.

(56) References Cited

U.S. PATENT DOCUMENTS

| | | |
|---|---|---|
| 10,756,054 B1 | 8/2020 | Huang |
| 2018/0102322 A1* | 4/2018 | Kang ...................... H01L 24/19 |
| 2019/0131224 A1 | 5/2019 | Choi et al. |
| 2020/0350254 A1* | 11/2020 | Huang .................... H01L 21/52 |
| 2021/0265274 A1 | 8/2021 | Joo et al. |
| 2021/0384095 A1 | 12/2021 | Kim et al. |
| 2021/0391291 A1 | 12/2021 | Lee et al. |

OTHER PUBLICATIONS

Final Office Action for U.S. Appl. No. 17/204,829, issued Oct. 13, 2023, 8 pages.
Non-Final Office Action for U.S. Appl. No. 17/204,829, issued Apr. 12, 2023, 10 pages.
Notice of Allowance for U.S. Appl. No. 17/204,829, issued Dec. 13, 2023, 7 pages.

* cited by examiner

*Primary Examiner* — Thanh T Nguyen
(74) *Attorney, Agent, or Firm* — FOLEY & LARDNER LLP

(57) ABSTRACT

A semiconductor substrate structure and a method of manufacturing a semiconductor substrate structure are provided. The semiconductor substrate structure includes a substrate, an electronic device, and a filling material. The substrate defines a cavity. The electronic device is disposed in the cavity and spaced apart from the substrate by a gap. The filling material is disposed in the gap and covers a first region of an upper surface of the electronic device.

15 Claims, 13 Drawing Sheets

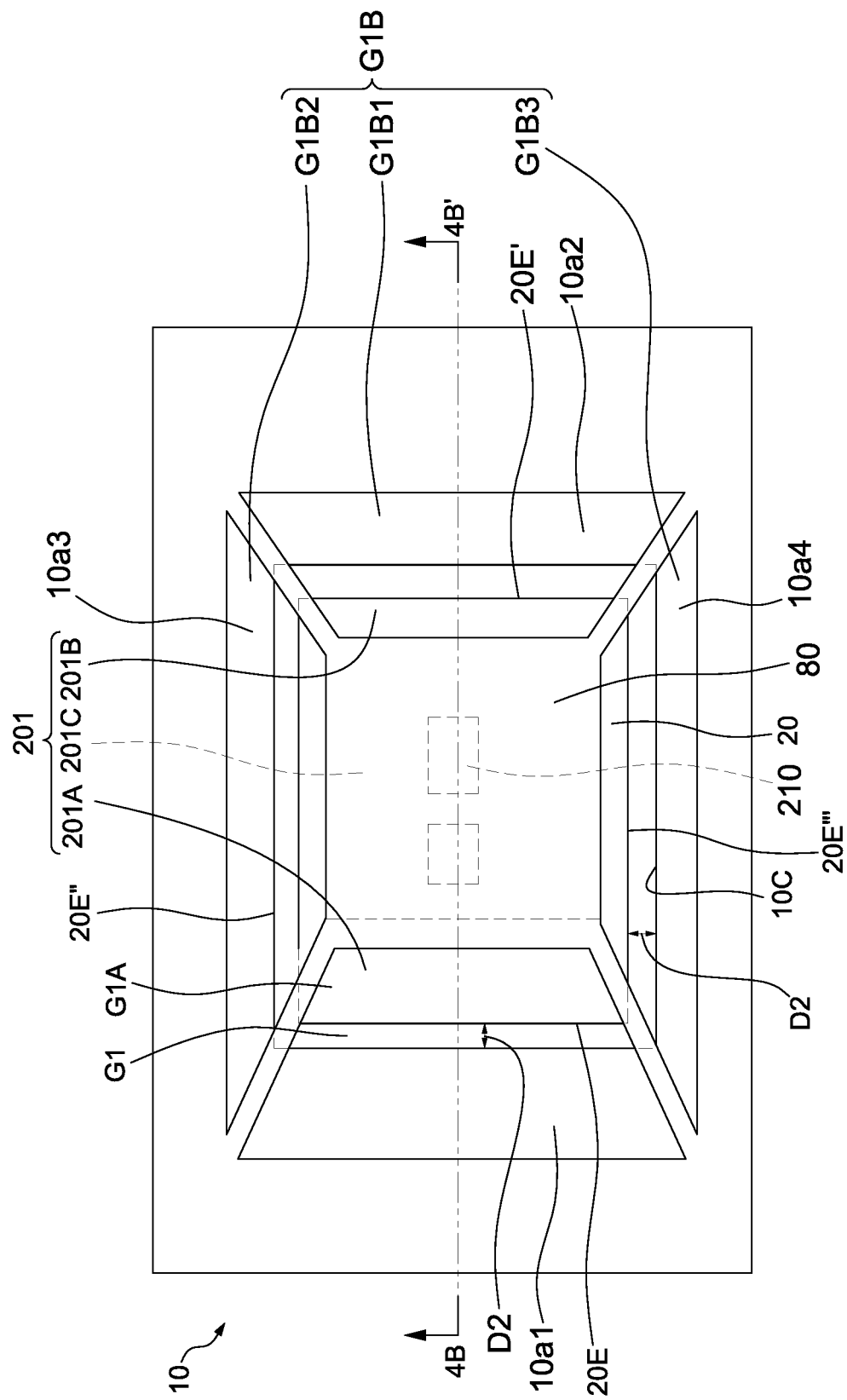
FIG. 4B1

SEMICONDUCTOR SUBSTRATE STRUCTURE AND METHOD OF MANUFACTURING THE SAME

CROSS-REFERENCE TO RELATED APPLICATION

This application is a continuation of U.S. patent application Ser. No. 17/204,829, filed Mar. 17, 2021, the content of which is incorporated herein by reference in its entirety.

BACKGROUND

1. Technical Field

The present disclosure relates generally to a semiconductor substrate structure and a method of manufacturing a semiconductor package structure.

2. Description of the Related Art

Along with the rapid development in electronics industry and the progress of semiconductor processing technologies, semiconductor chips are integrated with an increasing number of electronic components to achieve improved electrical performance and additional functions. However, the increasing number of electronic components increases the overall size of the package. Embedded substrates having cavities to accommodate electronic components, followed by filling gaps between the electronic components and the substrate with filling materials, are provided to solve the aforesaid issues. However, warpage may easily occur due to the coefficient of thermal expansion (CTE) mismatch between the filling materials and the electronic components.

SUMMARY

In one or more embodiments, a semiconductor substrate structure includes a substrate, an electronic device, and a filling material. The substrate defines a cavity. The electronic device is disposed in the cavity and spaced apart from the substrate by a gap. The filling material is disposed in the gap and covers a first region of an upper surface of the electronic device.

In one or more embodiments, a semiconductor substrate structure includes a substrate, an electronic device, a filling material, and a dielectric layer. The substrate defines a cavity. The electronic device is disposed in the cavity. The filling material includes a protrusion disposed on a first region of an upper surface of the electronic device. The dielectric layer is disposed over the electronic device and includes an extending portion engaged with the protrusion of the filling material.

In one or more embodiments, a method of manufacturing a semiconductor substrate structure includes the following operations: providing a substrate, the substrate defining a cavity; disposing an electronic device in the cavity, the electronic device being spaced apart from the substrate by a gap, and the gap includes a first inlet end and a second inlet end; and applying a filling material into the gap via the first inlet end and the second inlet end, wherein a flow rate of the filling material at the first inlet end is greater than a flow rate of the filling material at the second inlet end.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 4A, FIG. 4B, FIG. 4B1, FIG. 4C, FIG. 4D, FIG. 4E, and FIG. 4F illustrate various operations in a method of manufacturing a semiconductor substrate structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
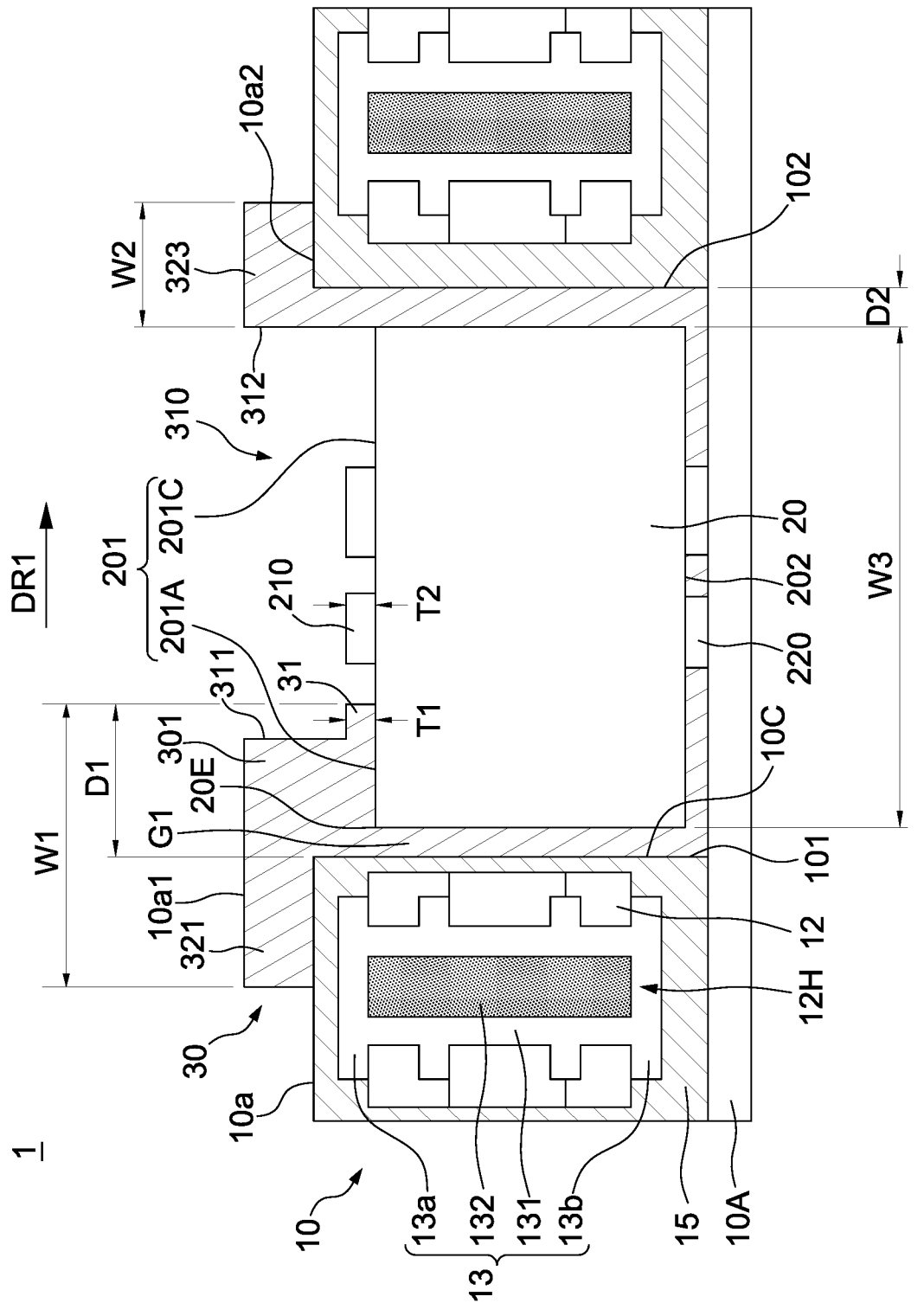
FIG. 1 illustrates a cross-sectional view of a semiconductor substrate structure in accordance with some embodiments of the present disclosure.

FIG. 1 illustrates a cross-sectional view of a semiconductor substrate structure 1 in accordance with some embodiments of the present disclosure. The semiconductor substrate structure 1 includes a substrate 10, an electronic device 20, a filling material 30, and conductive pads 210 and 220.

The substrate 10 may define a cavity 10C. In some embodiments, the cavity 10C has at least a sidewall 101 and a sidewall 102 opposite to the sidewall 101. In some embodiments, the cavity 10C is exposed from an upper surface 10a of the substrate 10. In some embodiments, the cavity 10C is a through cavity that penetrates the substrate 10. In some other embodiments, the cavity 10C may be a recess that recesses from the upper surface 10a without penetrating the substrate 10. In some embodiments, the substrate 10 may have a CTE of less than about 20 $10^{-6}$/K.

In some embodiments, the semiconductor substrate structure 1 may further include a carrier 10A, and the substrate 10 together with the carrier 10A may define the cavity 10C. The carrier 10A may include, for example, a printed circuit board, such as a paper-based copper foil laminate, a composite copper foil laminate, a polymer-impregnated glass-fiber-based copper foil laminate, or a tape. The carrier 10A may include an interconnection structure, such as a plurality of conductive traces or a through via. In some embodiments, the carrier 10A includes a ceramic material or a metal plate. In some embodiments, the substrate 10 includes a base layer 12, one or more interconnection vias 13, and a dielectric layer 15.

The material of the base layer 12 may include a dielectric material or an insulating material. The base layer 12 may be a core substrate, a coreless substrate, or other suitable substrate. The base layer 12 may include a plurality of sub-layers. The base layer 12 may define at least one through hole 12H. The interconnection via 13 is disposed in the through hole 12H. The interconnection via 13 may include a base conductive layer 131 and an insulation material 132. The base conductive layer 131 is disposed or formed on a side wall of the through hole 12H, and defines a central through hole. The insulation material 132 fills the central through hole defined by the base conductive layer 131. In some embodiments, the insulation material 132 may be omitted, and a bulk conductive material may fill the through hole 12H to form the interconnection via. In some embodiments, the interconnection via 30 may further include a plurality of wiring layers or conductive patterns disposed on the sub-layers of the base layer 12 and connected to the base conductive layer 131. In some embodiments, the interconnection via 13 may further include an upper electrode 13a and a bottom electrode 13b respectively disposed on the upper surface and the bottom surface of the base layer 12, and electrically connected to the base conductive layer 131. In some embodiments, the dielectric layer 15 is disposed on the upper electrode 13a, the bottom electrode 13b, and the base layer 12. In some embodiments, the dielectric layer 15 covers the upper electrode 13a, the bottom electrode 13b, and the base layer 12 and defines the cavity 10C.

The electronic device 20 may be disposed in the cavity 10C. In some embodiments, the electronic device 20 is spaced apart from the substrate 10 by a gap G1. The electronic device 20 has an upper surface 201 and a bottom surface 202 opposite to the upper surface 201. In some embodiments, the upper surface 201 may be leveled with or lower than the upper surface 10a of the substrate 10. In some embodiments, the upper surface 201 of the electronic device 20 includes a region 201A and a region 201C. In some embodiments, the region 201A of the upper surface 201 of the electronic device 20 is proximal to an edge (e.g., edge 20E) of the electronic device 20. In some embodiments, the region 201A of the upper surface 201 of the electronic device 20 is along with an edge (e.g., edge 20E) of the electronic device 20. In some embodiments, the region 201C is at a central region of the upper surface 201 of the electronic device 20. In some embodiments, the electronic device 20 includes an active devices such as a transistor and/or a passive device such as a resistor, a capacitor, an inductor, or a combination thereof. In some embodiments, the electronic device 20 (e.g., silicon-based layers) may have a CTE of less than about $10 \cdot 10^{-6}$/K. In some embodiments, the electronic device 20 (e.g., silicon-based layers) may have a CTE of less than about $5 \cdot 10^{-6}$/K. In some embodiments, the electronic device 20 (e.g., silicon-based layers) may have a CTE from about $3 \cdot 10^{-6}$/K to about $5 \cdot 10^{-6}$/K.

In some embodiments, the conductive pads 210 are disposed on the region 201C of the upper surface 201 of the electronic device 20. In some embodiments, the conductive pad 210 has a thickness T2 of equal to or greater than about 15 μm. In some embodiments, the thickness T2 of the conductive pad 210 is from about 15 μm to about 25 μm. In some embodiments, the conductive pads 220 are disposed under the bottom surface 202 of the electronic device 20. In some embodiments, the conductive pads 220 are between the bottom surface 202 of the electronic device 20 and the bottom surface of the cavity 10C.

The filling material 30 may be disposed in the gap G1. In some embodiments, the filling material 30 partially covers the upper surface 201 of the electronic device 20. In some embodiments, the filling material 30 covers the region 201A of the upper surface 201 of the electronic device 20. In some embodiments, the filling material 30 contacts the region 201A of the upper surface 201 of the electronic device 20. In some embodiments, the filling material 30 directly or physically contacts the region 201A of the upper surface 201 of the electronic device 20. In some embodiments, the filling material 30 further covers the bottom surface 202 of the electronic device 20. In some embodiments, the conductive pads 220 are covered or surrounded by the filling material 30. In some embodiments, the filling material 30 may include resin, ink (e.g. Ajinomoto build-up film (ABF) ink), or a molding compound. In some embodiments, the filling material 30 may have a CTE of greater than about $20 \cdot 10^{-6}$/K. In some embodiments, the filling material 30 may have a CTE of equal to or greater than about $30 \cdot 10^{-6}$/K. In some embodiments, the filling material 30 may have a CTE from about $30 \cdot 10^{-6}$/K to about $40 \cdot 10^{-6}$/K. In some embodiments, a difference between the CTE of the filling material 30 and the CTE of the substrate 10 is less than a difference between the CTE of the filling material 30 and the CTE of the electronic device 20.

In some embodiments, the filling material 30 includes a protrusion 31 disposed on the region 201A of the upper surface 201 of the electronic device 20. In some embodiments, the protrusion 31 of the filling material 30 contacts the region 201A of the upper surface 201 of the electronic device 20. In some embodiments, the protrusion 31 of the filling material 30 directly or physically contacts a portion of the region 201A of the upper surface 201 of the electronic device 20. In some embodiments, the protrusion 31 of the filling material 30 has a thickness T1 that is substantially the same as the thickness T2 of the conductive pad 210.

In some embodiments, the filling material 30 includes a portion 301 (which is also referred to as "a stepped portion"). In some embodiments, the portion 301 of the filling material 30 covers the region 201A of the upper surface 201 of the electronic device 20. In some embodiments, the portion 301 of the filling material 30 contacts the region 201A of the upper surface 201 of the electronic device 20. In some embodiments, the portion 301 of the filling material 30 includes the protrusion 31. In some embodiments, the filling material 30 includes a plurality of fillers. In some embodiments, a density of the fillers proximal to the region 201A of the upper surface 201 of the electronic device 20 is less than a density of the fillers proximal to the bottom surface 202 of the electronic device 20. In some embodiments, a density of the fillers proximal to the region 201A of the upper surface 201 of the electronic device 20 is less than a density of the fillers proximal to the region 201C of the upper surface 201 of the electronic device 20.

In some embodiments, the region 201C of the upper surface 201 of the electronic device 20 is free from being covered by the filling material 30. In some embodiments, the region 201C of the upper surface 201 of the electronic device 20 is spaced apart from the filling material 30. In some embodiments, the filling material 30 defines an opening 310. In some embodiments, the opening 310 of the filling material 30 exposes the region 201C of the upper surface 201 of the electronic device 20. In some embodiments, the conductive pads 210 are exposed from the opening 310 of the filling material 30. In some embodiments, the conductive pads 210 on the region 201C of the upper surface 201 of the electronic device 20 are free from being covered by the filling material 30. In some embodiments, a distance D1 between a sidewall 311 of the opening 310 and the sidewall 101 of the cavity 10C is different from a distance D2 (which is also referred to as a width of the gap G1) between a sidewall 312 of the opening 310 and the sidewall 102 of the cavity 10C. In some embodiments, the distance D1 is greater than the distance D2 (i.e., the width of the gap G1). In some embodiments, the distance D2 (i.e., the width of the gap G1) is greater than the thickness T2 of the conductive pad 210. In some embodiments, a ratio (D2/T2) of the distance D2 (i.e., the width of the gap G1) to the thickness T2 of the conductive pad 210 is greater than about 2. In some embodiments, a ratio (D2/T2) of the distance D2 (i.e., the width of the gap G1) to the thickness T2 of the conductive pad 210 is equal to or greater than about 4. For example, the distance D2 may be about 100 µm, and the thickness T2 of the conductive pad 210 may be about 25 µm.

In some embodiments, the filling material 30 further covers one or more portions of the upper surface 10a of the substrate 10. In some embodiments, the upper surface 10a of the substrate 10 includes a portion 10a1 proximal to the sidewall 101 of the cavity 10C and a portion 10a2 proximal to the sidewall 102 of the cavity 10C. In some embodiments, the portion 10a1 of the upper surface 10a is connected to the sidewall 101 of the cavity 10C. In some embodiments, the portion 10a1 of the upper surface 10a is proximal to the region 201A of the upper surface 201 and distal from the region 201C of the upper surface 201 of the electronic device 20. In some embodiments, the filling material 30 covers the portion 10a1 of the upper surface 10a of the substrate 10. In some embodiments, the portion 10a2 of the upper surface 10a is connected to the sidewall 102 of the cavity 10C. In some embodiments, the filling material 30 covers the portion 10a2 of the upper surface 10a of the substrate 10.

According to some embodiments of the present disclosure, since the difference between the CTE of the filling material 30 and the CTE of the substrate 10 is relatively small, for example, less than the difference between the CTE of the filling material 30 and the CTE of the electronic device 20, the adhesion between the filling material 30 and the substrate 10 is relatively improved, for example, greater than the adhesion between the filling material 30 and the electronic device 20. Moreover, according to some embodiments of the present disclosure, the filling material 30 further covers or contacts one or more portions of the upper surface 10a of the substrate 10, and thus the bonding strength between the filling material 30 and the substrate 10 can be further improved with the increased contact area between the filling material 30 and the substrate 10. In addition, while the adhesion between the filling material 30 and the substrate 10 (e.g., the dielectric layer 15) is greater than the adhesion between the filling material 30 and the electronic device 20 (e.g., silicon-based layer), the increased contact area between the filling material 30 and the substrate 10 can further increase the overall adhesion between the filling material 30, the electronic device 20, and the substrate 10. Therefore, the delamination issue can be effectively prevented or reduced, and thus the reliability of the semiconductor substrate structure 1 can be further improved.

Figure 1B:
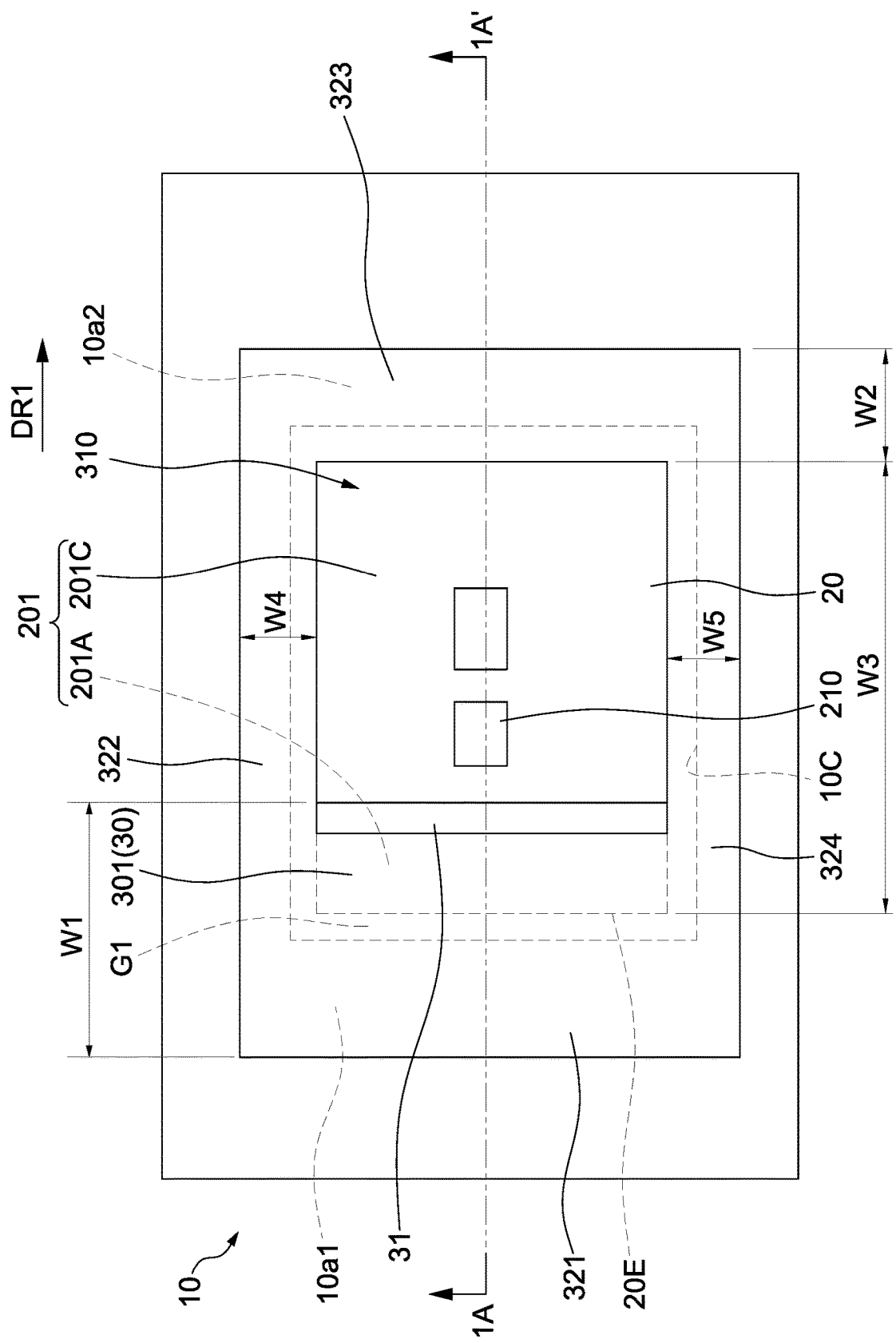
FIG. 1B illustrates a top view of a semiconductor substrate structure in accordance with some embodiments of the present disclosure.

FIG. 1B illustrates a top view of a semiconductor substrate structure 1 in accordance with some embodiments of the present disclosure. In some embodiments, FIG. 1 illustrates a cross-sectional view along the cross-sectional line 1A-1A' in FIG. 1B.

Referring to FIGS. 1 and 1B, in some embodiments, the filling material 30 includes a plurality of ribs (e.g., ribs 321, 322, 323, and 324) which define the opening 310. In some embodiments, the rib 321 covers the region 201A of the upper surface 201 of the electronic device 20. In some embodiments, the rib 323 is opposite to the rib 321, and a width W1 of the rib 321 is different from a width W2 of the rib 323. In some embodiments, the width W1 of the rib 321 is greater than the width W2 of the rib 323. In some embodiments, the width W1 of the rib 321 is different from a width W4 of the rib 322 and a width W5 of the rib 324. In some embodiments, the width W1 of the rib 321 is greater than the width W4 of the rib 322. In some embodiments, the width W1 of the rib 321 is greater than the width W5 of the rib 324.

In some embodiments, the filling material 30 has a substantially planar upper surface. In some embodiments, the upper surface of the ribs (e.g., ribs 321, 322, 323, and 324) of the filling material 30 are substantially coplanar.

Referring to FIGS. 1 and 1B, in some embodiments, an area of the portion 10a1 of the upper surface 10a of the substrate 10 covered by the rib 321 is different from an area of the portion 10a2 of the upper surface 10a of the substrate 10 covered by the rib 323. In some embodiments, the area of the portion 10a1 is greater than the area of the portion 10a2. In some embodiments, the upper surface 201 of the electronic device 20 has a width W3 along a direction DR1 substantially parallel to the width W1. In some embodiments, the width W3 satisfies the following condition: W3≥(W1+W2)/2. In some embodiments, the width W3 satisfies the following condition: W3>(W1+W2)/2. According to some embodiments of the present disclosure, with the aforesaid design of the widths W1, W2 and W3, the overall warpage of the semiconductor substrate structure 1 can be effectively reduced. For example, the warpage of a unit or a singulated semiconductor substrate structure 1 can be lower than about 50 µm, and the warpage of a panel type structure including unsingulated semiconductor substrate structures 1 can be lower than about 4 mm. Therefore, the reliability of the semiconductor substrate structure 1 can be improved.

According to some embodiments of the present disclosure, with the aforesaid design of the filling material 30 partially covers or contacts the upper surface 201 of the electronic device 20, since the contact region/area between the filling material 30 and the electronic device 20 is reduced, the warpage issue of the semiconductor substrate structures 1 due to the CTE mismatch between the filling material 30 and the electronic device 20 can be effectively reduced.

In addition, according to some embodiments of the present disclosure, the conductive pads 210 are free from being covered by the filling material 30, and thus the via holes for forming conductive through vias that electrically connect to the electronic device 20 only need to penetrate through a dielectric layer directly on the conductive pads 210 without further penetrating through composite layers of a filling material and a dielectric layer. Therefore, the subsequent manufacturing process for forming the conductive through vias is simplified, delamination issues between composite heterogeneous layers (e.g., multilayers of the electronic device 20/a filling material/a dielectric layer) can be effectively reduced, and thus the reliability of the semiconductor substrate structure 1 can be further improved.

Presented below are experimental results of exemplary semiconductor substrate structures. The exemplary semiconductor substrate structures have structures similar to that shown in FIGS. 1 and 1B. Table 1 shows the experimental results of the exemplary semiconductor substrate structures (E1-E5). In table 1, "W1" indicates the width W1 of the rib 321 proximal to the region 201A of the upper surface 201 of the electronic device 20, "W2" indicates the width W2 of the rib 323 distal from the region 201A of the upper surface 201 of the electronic device 20, "W3" indicates the width W3 of the upper surface 201 of the electronic device 20, and "Status" indicates the evaluation of the warpage optionally with detailed description.

TABLE 1

| | W1 (μm) | W2 (μm) | W3 (μm) | (W1 + W2)/2 | Warpage (mm) | Status |
|---|---|---|---|---|---|---|
| E1 | 600 | 400 | 500 | 500 | 3.2 | Good |
| E2 | 500 | 500 | 500 | 500 | 3.4 | Bubbles observed below the electronic device |
| E3 | 400 | 600 | 500 | 500 | 3.3 | Bubbles observed at sidewall of the electronic device |
| E4 | 600 | 400 | 300 | 500 | 3.7 | Good |
| E5 | 600 | 400 | 100 | 500 | 5.1 | Good |

Figure 2A:
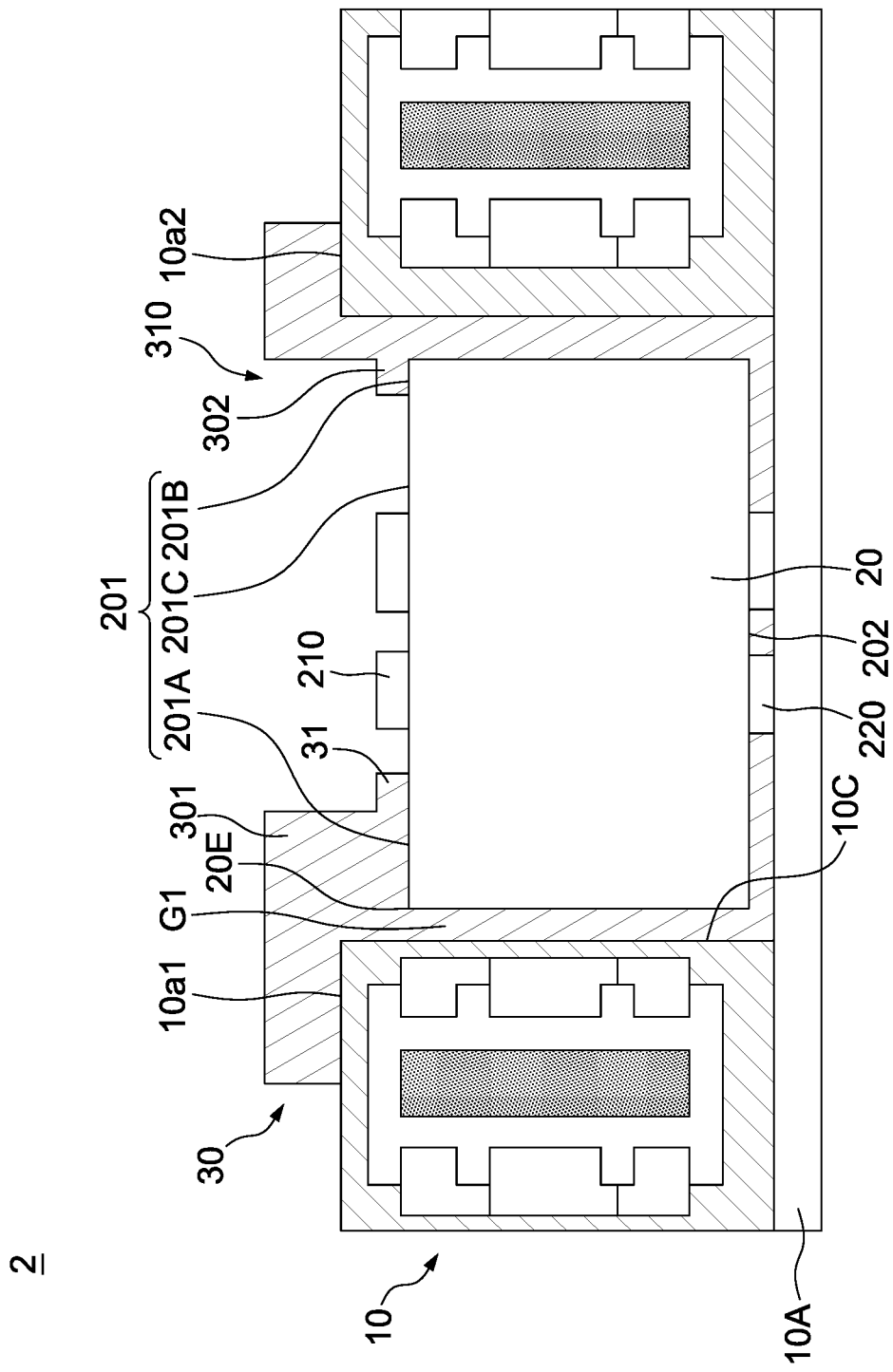
FIG. 2A illustrates a cross-sectional view of a semiconductor substrate structure in accordance with some embodiments of the present disclosure.

FIG. 2A illustrates a cross-sectional view of a semiconductor substrate structure 2 in accordance with some embodiments of the present disclosure. The semiconductor substrate structure 2 is similar to the semiconductor substrate structure 1 in FIG. 1, and some of the differences therebetween are described below.

In some embodiments, the upper surface 201 of the electronic device 20 further includes a region 201B different from the regions 201A and 201C. In some embodiments, the filling material 30 further includes a portion 302 above the region 201B of the upper surface 201 of the electronic device 20. In some embodiments, the portion 302 of the filling material 30 covers the region 201B of the upper surface 201 of the electronic device 20.

In some embodiments, a volume of the portion 301 of the filling material 30 above the region 201A of the upper surface 201 of the electronic device 20 is different from a volume of the portion 302 of the filling material 30 above the region 201B of the upper surface 201 of the electronic device 20. In some embodiments, the volume of the portion 301 is greater than the volume of the portion 302. In some embodiments, the filling material 30 includes a plurality of fillers, and a density of the fillers proximal to the region 201A is less than a density of the fillers proximal to the region 201B.

Figure 2B:
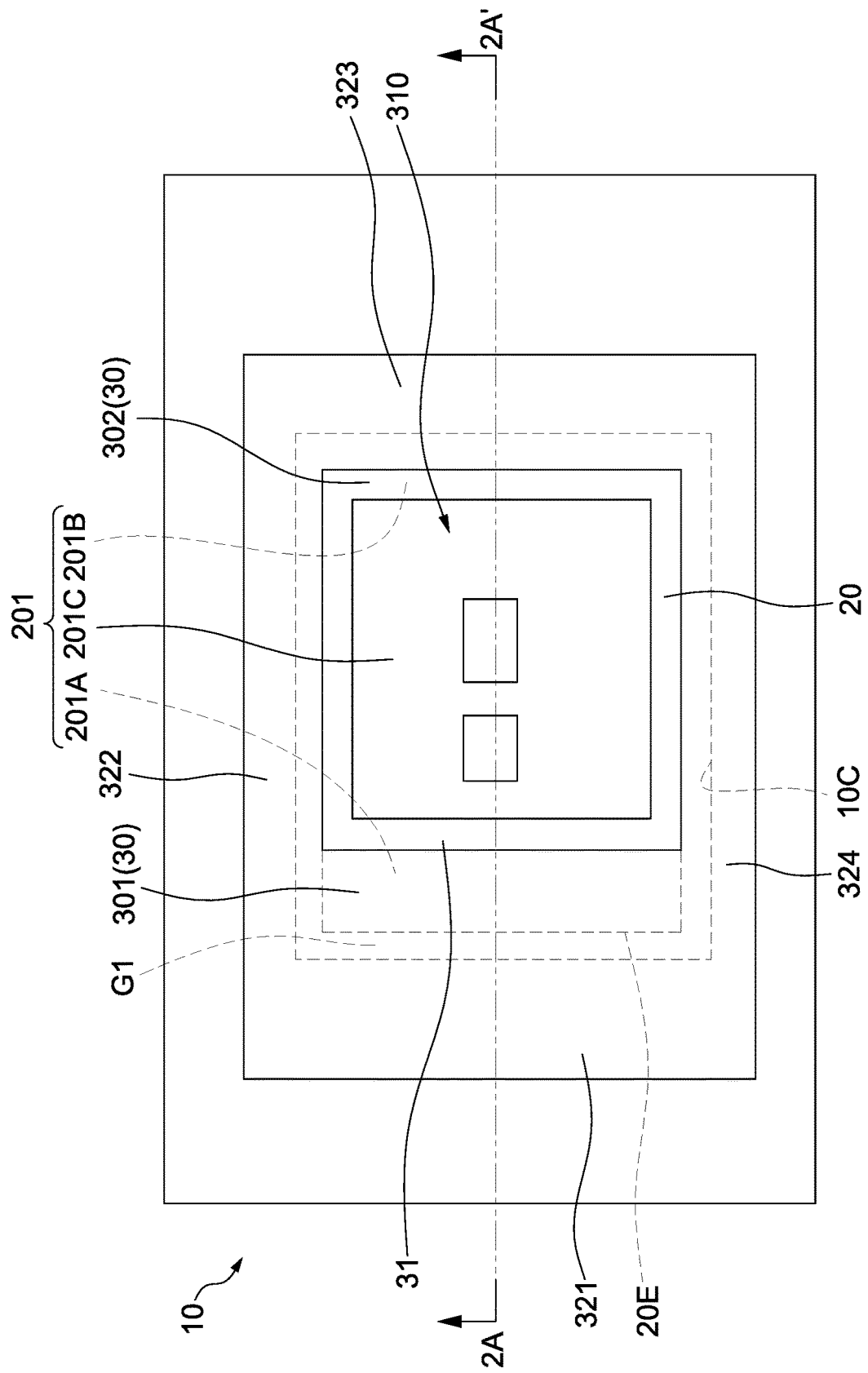
FIG. 2B illustrates a top view of a semiconductor substrate structure in accordance with some embodiments of the present disclosure.

FIG. 2B illustrates a top view of a semiconductor substrate structure 2 in accordance with some embodiments of the present disclosure. In some embodiments, FIG. 2A illustrates a cross-sectional view along the cross-sectional line 2A-2A' in FIG. 2B.

Referring to FIGS. 2A-2B, in some embodiments, an area of the region 201A of the upper surface 201 of the electronic device 20 is different from an area of the region 201B of the upper surface 201 of the electronic device 20. In some embodiments, the area of the region 201A of the upper surface 201 of the electronic device 20 is greater than the area of the region 201B of the upper surface 201 of the electronic device 20. In some embodiments, the rib 321 covers the region 201A of the upper surface 201 of the electronic device 20.

In some embodiments, the rib 323 covers the region 201B of the upper surface 201 of the electronic device 20. In some embodiments, an area of the region 201A of the upper surface 201 of the electronic device 20 covered by the rib 321 is greater than an area of the region 201B of the upper surface 201 of the electronic device 20 covered by the rib 323.

Figure 3A:
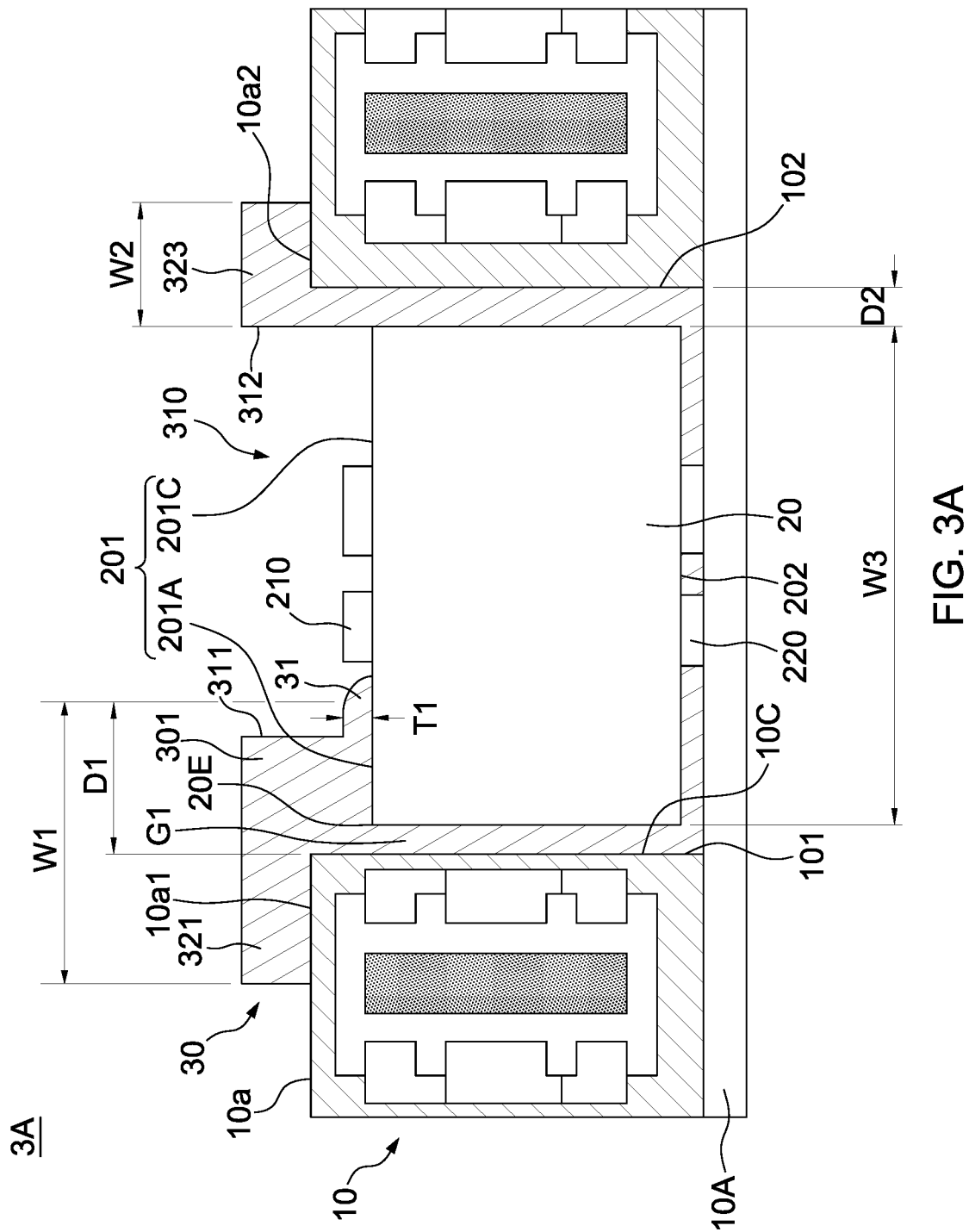
FIG. 3A illustrates a cross-sectional view of a semiconductor substrate structure in accordance with some embodiments of the present disclosure.

FIG. 3A illustrates a cross-sectional view of a semiconductor substrate structure 3A in accordance with some embodiments of the present disclosure. The semiconductor substrate structure 3A is similar to the semiconductor substrate structure 1 in FIG. 1, and some of the differences therebetween are described below.

In some embodiments, the portion 301 of the filling material 30 covers the region 201A of the upper surface 201 of the electronic device 20, and the portion 301 has an uneven upper surface. In some embodiments, the thickness of the portion 301 of the filling material 30 decreases along a direction from the gap G1 toward the electronic device 20. In some embodiments, the thickness of the portion 301 of the filling material 30 decreases along a direction from an edge (e.g., the edge 20E) of the electronic device 20 toward the conductive pads 210 over the electronic device 20. In some embodiments, the protrusion 31 of the portion 301 has an uneven upper surface. In some embodiments, the thickness T1 of the protrusion 31 of the portion 301 of the filling material 30 decreases along a direction from the gap G1 toward the electronic device 20. In some embodiments, the thickness T1 of the protrusion 31 of the portion 301 of the filling material 30 decreases along a direction from an edge (e.g., the edge 20E) of the electronic device 20 toward the conductive pads 210 over the electronic device 20. In some embodiments, the thickness T1 of the protrusion 31 of the portion 301 of the filling material 30 decreases from the sidewall 311 of the opening 310 toward the conductive pad 210.

Figure 3B:
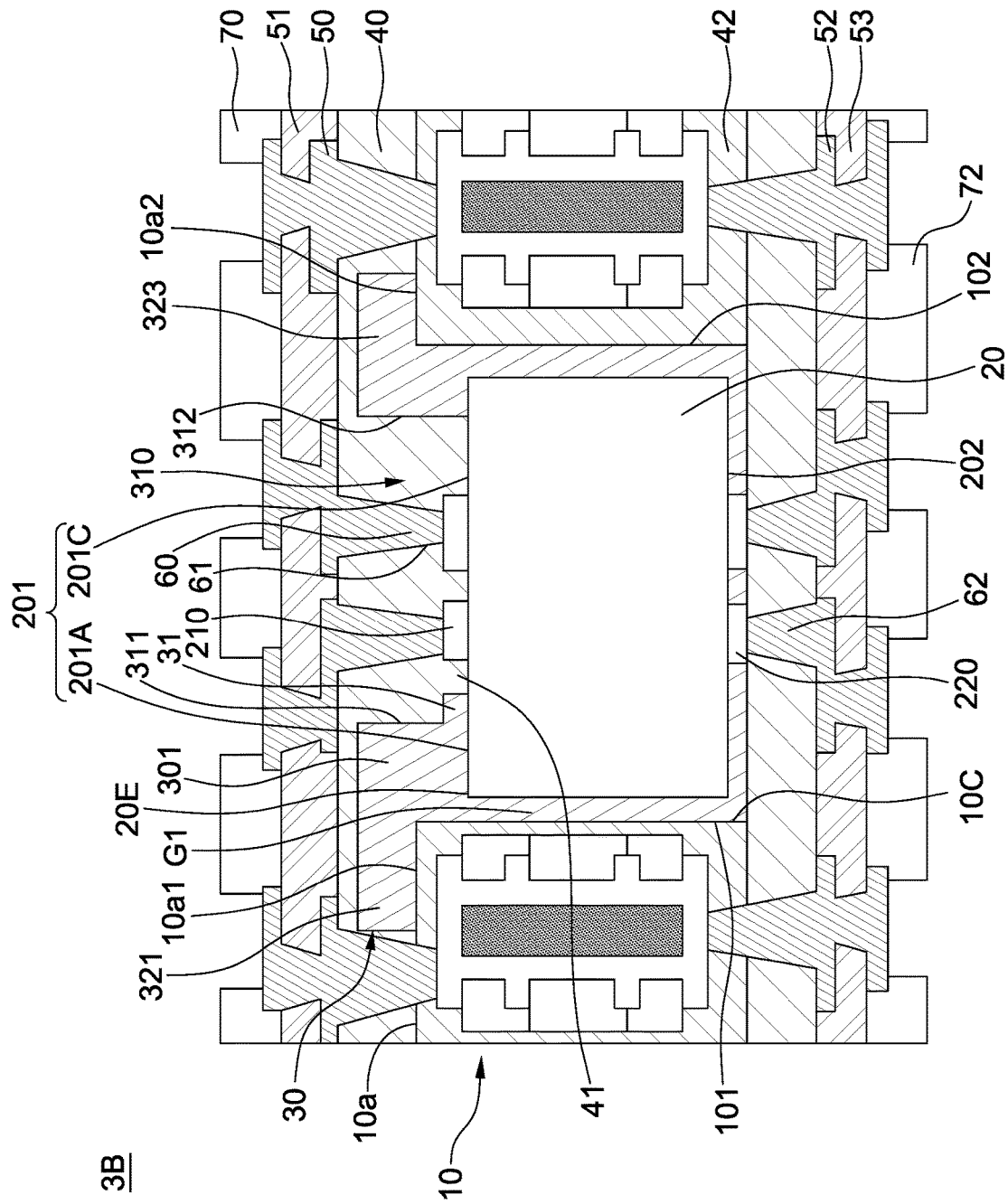
FIG. 3B illustrates a cross-sectional view of a semiconductor substrate structure in accordance with some embodiments of the present disclosure.

FIG. 3B illustrates a cross-sectional view of a semiconductor substrate structure 3B in accordance with some embodiments of the present disclosure. The semiconductor substrate structure 3A is similar to the semiconductor substrate structure 1 in FIG. 1, and some of the differences therebetween are described below.

In some embodiments, the semiconductor substrate structure 3B includes a substrate 10, an electronic device 20, a filling material 30, dielectric layers 40, 42, 51 and 53, one or more conductive elements 50 and 52, one or more conductive vias 60 and 62, solder masks 70 and 72, and conductive pads 210 and 220.

In some embodiments, the dielectric layer 40 is disposed over the electronic device 20 and includes an extending portion 41. In some embodiments, the extending portion 41 of the dielectric layer 40 is engaged with the protrusion 31 of the filling material 30. In some embodiments, the extending portion 41 of the dielectric layer 40 is interlocked with the protrusion 31 of the filling material 30. In some embodiments, the extending portion 41 of the dielectric layer 40 contacts the region 201C of the upper surface 201 of the electronic device. In some embodiments, the extending portion 41 of the dielectric layer 40 directly or physically contacts the region 201C of the upper surface 201 of the electronic device 20. In some embodiments, the extending portion 41 of the dielectric layer 40 directly or physically contacts the conductive pads 210 on the upper surface 201 of the electronic device 20. In some embodiments, the extending portion 41 of the dielectric layer 40 includes a stepped structure. In some embodiments, the stepped structure of the dielectric layer 40 conforms to a morphology of the portion 301 (or stepped portion) of the filling material 30.

In some embodiments, the conductive element 50 is disposed on the dielectric layer 40 and electrically connected to the electronic device 20 through the conductive via 60 within the dielectric layer 40. In some embodiments, the conductive via 60 has a continuous sidewall 61 extending from the conductive element 50 toward the electronic device 20. In some embodiments, the conductive via 60 is spaced apart from the filling material 30. In some embodiments, the extending portion 41 of the dielectric layer 40 is between the filling material 30 and the conductive via 60.

In some embodiments, the dielectric layer 42 is disposed under the bottom surface 202 of the electronic device 20. In some embodiments, the conductive element 52 is electrically connected to the electronic device 20 through the conductive via 62 within the dielectric layer 42. In some embodiments, the conductive via 62 is electrically connected to the electronic device 20 through the conductive pads 220 within the cavity 10C filled with the filling material 30. In some embodiments, the dielectric layers 40 and 42 may include an organic dielectric material and/or an inorganic dielectric material, for example, bismaleimide triazine (BT), polyimide (PI), polybenzoxazole (PBO), an Ajinomoto build-up film (ABF), polypropylene (PP), silicon oxide, silicon nitride, silicon oxynitride, or the like.

In some embodiments, the conductive elements 50 and 52 may include one or more circuit layers including one or more conductive wiring patterns. In some embodiments, the conductive elements 50 and 52 may include redistribution layers or wiring layers stacked with the dielectric layers 51 and 53, respectively. In some embodiments, the solder masks 70 and 72 may define openings for solder balls to be disposed on and electrically connected to the conductive elements 50 and 52, respectively, to facilitate external electrical connection.

According to some embodiments of the present disclosure, the extending portion 41 of the dielectric layer 40 interlocked with the protrusion 31 of the filling material 30 can provide an increased inter-bonding strength between the dielectric layer 40 and the filling material 30, which is similar to a mold-lock effect. Therefore, the overall adhesion between the filling material 30, the dielectric layer 40, and the electronic device 20 can be increased, and thus the reliability of the semiconductor substrate structure 3B can be improved.

In addition, according to some embodiments of the present disclosure, the extending portion 41 of the dielectric layer 40 directly or physically contacts the conductive pads 210 on the electronic device 20, and thus the via holes for forming the conductive vias 60 that electrically connect to the electronic device 20 only need to penetrate through the dielectric layer 40 directly on the conductive pads 210 without further penetrating through composite layers of the filling material 30 and the dielectric layer 40. Therefore, the manufacturing process for forming the conductive vias 60 is simplified, delamination issues between composite heterogeneous layers (e.g., multilayers of the electronic device 20/the filling material 30/the dielectric layer 40) can be effectively reduced, and thus the reliability of the semiconductor substrate structure 3B can be further improved.

FIG. 4A, FIG. 4B, FIG. 4B1, FIG. 4C, FIG. 4D, FIG. 4E, and FIG. 4F illustrate various operations in a method of manufacturing a semiconductor substrate structure in accordance with some embodiments of the present disclosure.

Figure 4A:
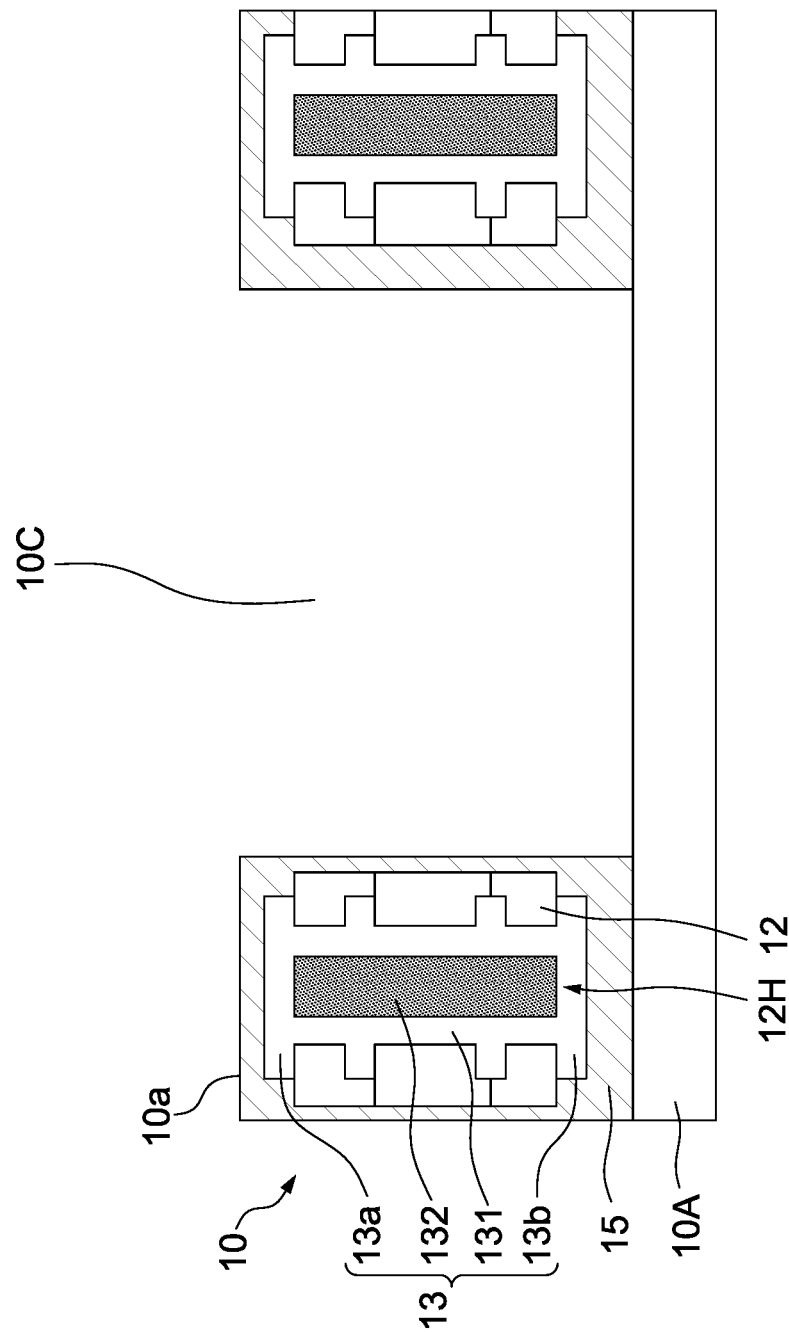

Referring to FIG. 4A, a substrate 10 may be provided, and the substrate 10 may define a cavity 10C. In some embodiments, the cavity 10C is exposed from an upper surface 10a of the substrate 10. In some embodiments, a carrier 10A may be further provided, and the substrate 10 together with the carrier 10A define the cavity 10C.

In some embodiments, the substrate 10 may be formed by the following operations: providing a base layer 12 having a through hole 12H, disposing a base conductive layer 131 on a side wall of the through hole 12H to define a central through hole, filling the central through hole with an insulation material 132, forming an upper electrode 13a and a bottom electrode 13b respectively on the upper surface and the bottom surface of the base layer 12, and covering the base layer 12 with a dielectric layer 15, and removing a portion of the dielectric layer 15 to form the cavity 10C. In some embodiments, the dielectric layer 15 may be disposed on a carrier 10A prior to or after performing the operation of removing a portion of the dielectric layer 15, and the substrate 10 and the carrier 10A collectively define the cavity 10C.

Figure 4B:
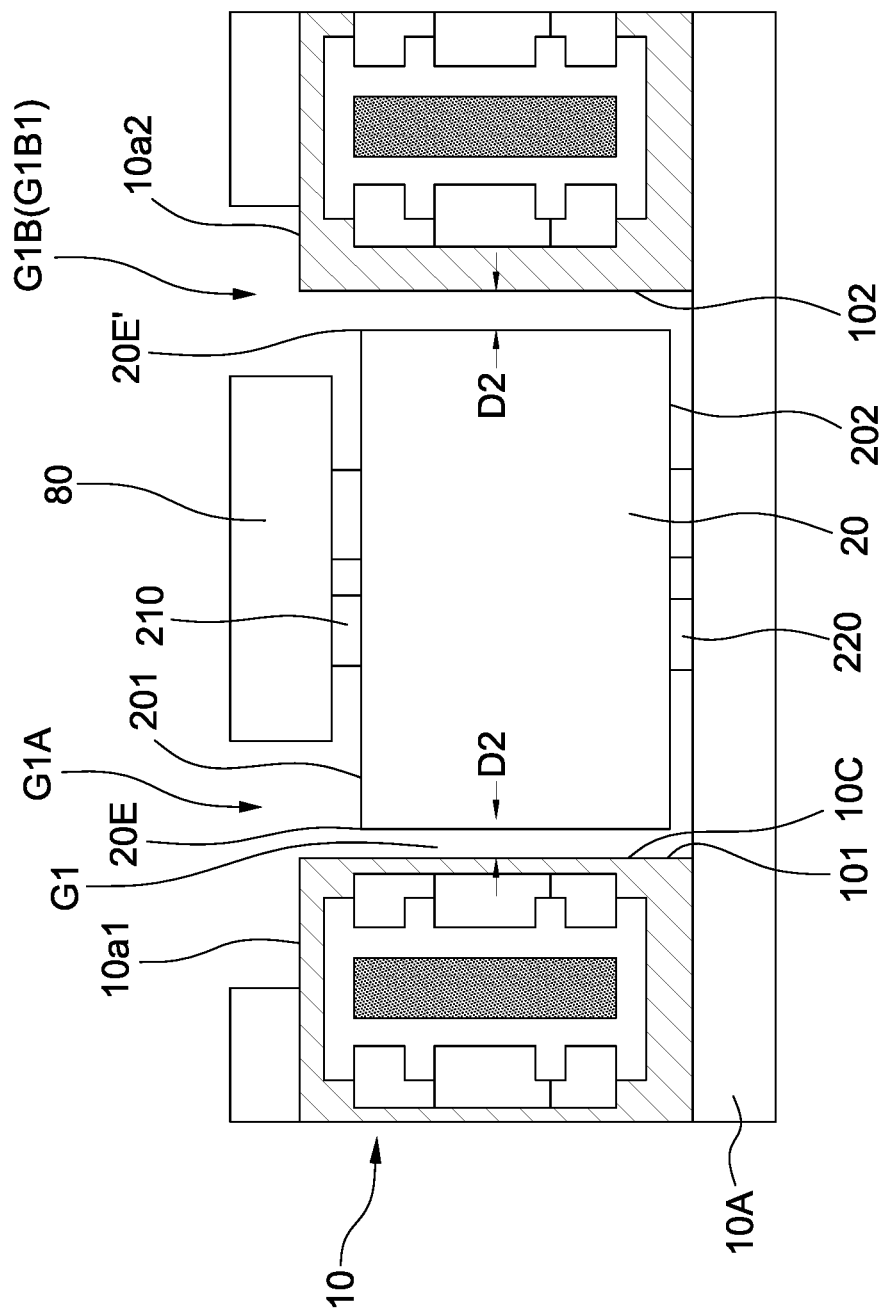

Referring to FIG. 4B and FIG. 4B1, FIG. 4B1 illustrating a cross-sectional view along the cross-sectional line 4B-4B' in FIG. 4B, an electronic device 20 may be disposed in the cavity 10C. In some embodiments, the electronic device 20 may be disposed on the carrier 10A. In some embodiments, conductive pads 210 may be disposed on the upper surface 201 of the electronic device 20. In some embodiments, conductive pads 220 may be disposed on the carrier 10A and connected to the bottom surface 202 of the electronic device 20. In some embodiments, the electronic device 20 is spaced apart from the substrate 10 by a gap G1, and the gap G1 includes an inlet region G1A (also referred to as "a first inlet end") and an outlet region G1B (also referred to as "an outlet end" or "a second inlet end"). In some embodiments, the inlet region G1A and the outlet region G1B are both over the upper surface 201 of the electronic device 20. In some embodiments, the inlet region G1A and the outlet region G1B are at the same side (i.e., the side proximal to the upper surface 201) of the electronic device 20. In some embodiments, as shown in FIG. 4B1, the gap G1 surrounds the electronic device 20. In some embodiments, the gap G1 has a substantially consistent width D2. In some embodiments, the width D2 of the gape G1 is substantially constant surrounding the electronic device 20.

Still referring to FIG. 4B and FIG. 4B1, a fixture 80 may be disposed over the substrate 10, and the fixture 80 may define the inlet region G1A and the outlet region G1B. In some embodiments, the inlet region G1A and the outlet region G1B include openings having different sizes. In some embodiments, the size of the opening of the inlet region G1A is greater than the size of the opening of the outlet region G1B. The opening of the inlet region G1A of the fixture 80 corresponds to the first inlet and of the gap G1, and the opening of the inlet region G1BN of the fixture 80 corresponds to the second inlet end of the gap G1. In some embodiments, the inlet region G1A includes one opening, and the outlet region G1B includes one or more openings (e.g., openings G1B1, G1B2, and G1B3) each having a size less than that of the opening of the inlet region G1A. In some embodiments, the fixture 80 may be a metal plate, for example, a stainless plate.

Still referring to FIG. 4B1, in some embodiments, the inlet region G1A exposes an edge portion (i.e., portion 10a1) of the upper surface 10a of the substrate 10 and an edge portion (e.g., a portion proximal to the edge 20E) of the upper surface 201 of the electronic device 20. In some embodiments, the outlet region G1B exposes another edge portion(s) of the upper surface 10a of the substrate 10 and another edge portion(s) of the upper surface 201 of the electronic device 20. In some embodiments, the opening G1B1 of the outlet region G1B exposes the portion 10a2 of the upper surface 10a of the substrate 10 and the edge portion proximal to the edge 20E' of the upper surface 201 of the electronic device 20. In some embodiments, the opening G1B2 of the outlet region G1B exposes the portion 10a3 of the upper surface 10a of the substrate 10 and the edge portion proximal to the edge 20E" of the upper surface 201 of the electronic device 20. In some embodiments, the opening G1B3 of the outlet region G1B exposes the portion 10a4 of the upper surface 10a of the substrate 10 and the edge portion proximal to the edge 20E'" of the upper surface 201 of the electronic device 20.

Still referring to FIG. 4B 1, the fixture 80 includes a blocking portion covering a portion (i.e., the region 201C) of the upper surface 201 of the electronic device 20. In some embodiments, the blocking portion of the fixture 80 covers the conductive pads 210 on the upper surface 201 of the electronic device 20. In some embodiments, a ratio of an area of the blocking portion of the fixture 80 to an area of the upper surface 201 (e.g., including the regions 201C, 201B and 201C) of the electronic device 20 is from about 0.7 to less than about 1. In some embodiments, the fixture 80 includes a plurality of openings exposing a plurality of portions (e.g., the regions 201A and 201B) of the upper surface 201 of the electronic device 20. In some embodiments, the openings of the fixture 80 correspond to the inlet region G1A and the outlet region G1B. In some embodiments, the positions of the openings of the fixture 80 correspond to that of the inlet region G1A and the outlet region G1B. In some embodiments, the shapes and the sizes of the openings of the fixture 80 correspond to that of the inlet region G1A and the outlet region G1B.

Figure 4C:
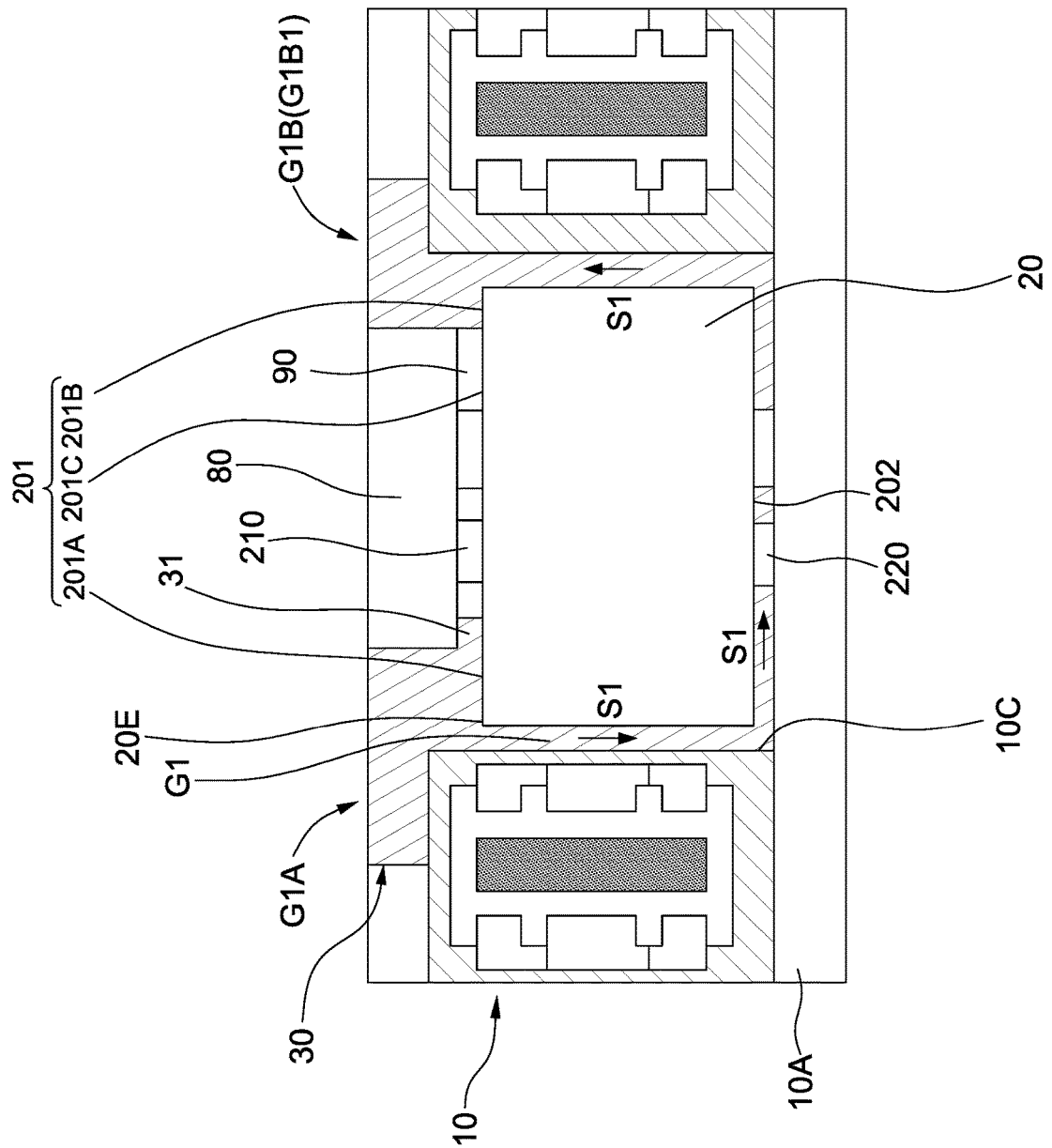

Referring to FIG. 4C, a filling material 30 is applied in the gap G1 from the inlet region G1A. As the filling material 30 is filled into the gap G1, the filling material 30 flows along the flowing direction S1 to fill the gap G1. In some embodiments, a portion of the filling material 30 flows out of the gap G1 from the outlet region G1B. In some embodiments, a flow rate of the filling material 30 at the inlet region G1A is greater than a flow rate of the filling material 30 at the outlet region G1B during the operation of applying the filling material 30. In some embodiments, the filling material 30 includes fillers, and the fillers also flow along the flowing direction S1 in the gap G1. In some embodiments, the relatively high flow rate proximal to the inlet region G1A may render the fillers spreading more diversely at the inlet region G1A, and the relatively low flow rate proximal to the outlet region G1B may render the fillers spreading more densely at the outlet region G1B. Accordingly, the density of the fillers in the filling material 30 may increase with the decrease of the flow rate as the filling material 30 flows along the flowing direction S1 from the inlet region G1A toward the outlet region G1B. In some embodiments, a density of the fillers proximal to the inlet region G1A is less than a density of the fillers proximal to the outlet region G1B. In some embodiments, a density of the fillers proximal to the inlet region G1A is less than a density of the fillers proximal to the bottom surface 202 of the electronic device 20. In some embodiments, voids 90 may be present between the upper surface 201 of the electronic device 20 and the fixture 80. In some embodiments, the conductive pads 210 are spaced apart from the filling material 30 by the voids 90.

In some embodiments, the inlet region G1A and the outlet region G1B may serve as a first inlet end and a second inlet end, respectively, and the filling material 30 may be applied in the gap G1 via the first inlet end (i.e., the inlet region G1A) and the second inlet end (i.e., the outlet region G1B). In some embodiments, a flow rate of the filling material 30 at the first inlet end (i.e., the inlet region G1A) is greater than a flow rate of the filling material 30 at the second inlet end (i.e., the outlet region G1B) during the operation of applying the filling material 30.

In some embodiments, the fixture 80 is disposed over the substrate 10 prior to applying the filling material 30. In some embodiments, the distance between the fixture 80 and the electronic device 20 is defined by the thickness T2 of the conductive pad 210. In some embodiments, a portion of the filling material 30 flowing in-between the fixture 80 and the electronic device 20 may form a protrusion 31 having a thickness T1 that is substantially the same as the thickness T2 of the conductive pad 210 (i.e., the distance between the fixture 80 and the electronic device 20). In some embodiments, portions of the filling material 30 protruded out of the openings of the fixture 80 may be removed, for example, by scraping off the excessed portions of the filling material 30 along the upper surface of the fixture 80. In some embodiments, the as-formed filling material 30 has a substantially planar upper surface after the scraping operation.

In some other embodiments, the fixture 80 may be omitted, and the size of the opening of the inlet region G1A may be equal to or less than the size of the openings of the outlet region G1B. In some embodiments, a relatively great force may be applied on the filling material 30 at the inlet region G1A when directing the filling material 30 into the gap G1. In some embodiments, the filling material 30 may be applied into the gap G1 by injection. By applying a relatively great force on the filling material 30 at the inlet region G1A, a flow rate of the filling material 30 at the inlet region G1A is greater than a flow rate of the filling material 30 at the outlet region G1B during the operation of applying the filling material 30. In some embodiments, as mentioned above, the inlet region G1A and the outlet region G1B may serve as a first inlet end and a second inlet end while the fixture 80 may be omitted. In some embodiments, by applying a relatively great force on the filling material 30 at the first inlet end (i.e., the inlet region G1A) than that at the second inlet end (i.e., the outlet region G1B), a flow rate of the filling material 30 at the first inlet end (i.e., the inlet region G1A) is greater than a flow rate of the filling material 30 at the second inlet end (i.e., the outlet region G1B) during the operation of applying the filling material 30.

According to some embodiments of the present disclosure, with the design of the inlet region G1A and the outlet region G1B, bubbles originally within the filling material 30 can be flushed away out of the gap G1 from the outlet region G1B. Therefore, bubbles within the filling material 30 at regions under the bottom surface 202 of the electronic device 20 and adjacent to the sidewalls of the electronic device 20 can be reduced. In addition, according to some embodiments, with the aforesaid design (e.g., the difference in flow rates) of the first inlet end (i.e., the inlet region G1A) and the second inlet end (i.e., the outlet region G1B), bubbles within the filling material 30 at regions under the bottom surface 202 of the electronic device 20 can be pushed toward regions adjacent to the sidewalls of the electronic device 20. Since it is more difficult to expel bubbles below the electronic device 20 than to expel bubble at sidewalls of the electronic device 20, the aforesaid design of the first inlet end (i.e., the inlet region G1A) and the second inlet end (i.e., the outlet region G1B) is advantageous to further flushing or expelling away the bubbles in subsequent processes.

In addition, according to some embodiments of the present disclosure, with the design of the inlet region G1A and the outlet region G1B arranged at the same side (e.g., the side proximal to the upper surface 201 or distal from the bottom surface 202) of the electronic device 20, the bubbles within the filling material 30 at regions under the bottom surface 202 of the electronic device 20 and adjacent to the sidewalls of the electronic device 20 can be flushed away along the flowing direction S1 and out of the gap G1 from the outlet region G1B effectively.

Moreover, according to some embodiments of the present disclosure, by applying the filling material 30 with a higher flow rate at the inlet region G1A and a lower flow rate at the outlet region G1B, bubbles originally within the filling material 30 can be flushed away from the region under the bottom surface 202 of the electronic device 20, and thus the issues of bubbles located under the bottom surface 202 of the electronic device 20 can be effectively prevented or reduced.

Figure 4D:
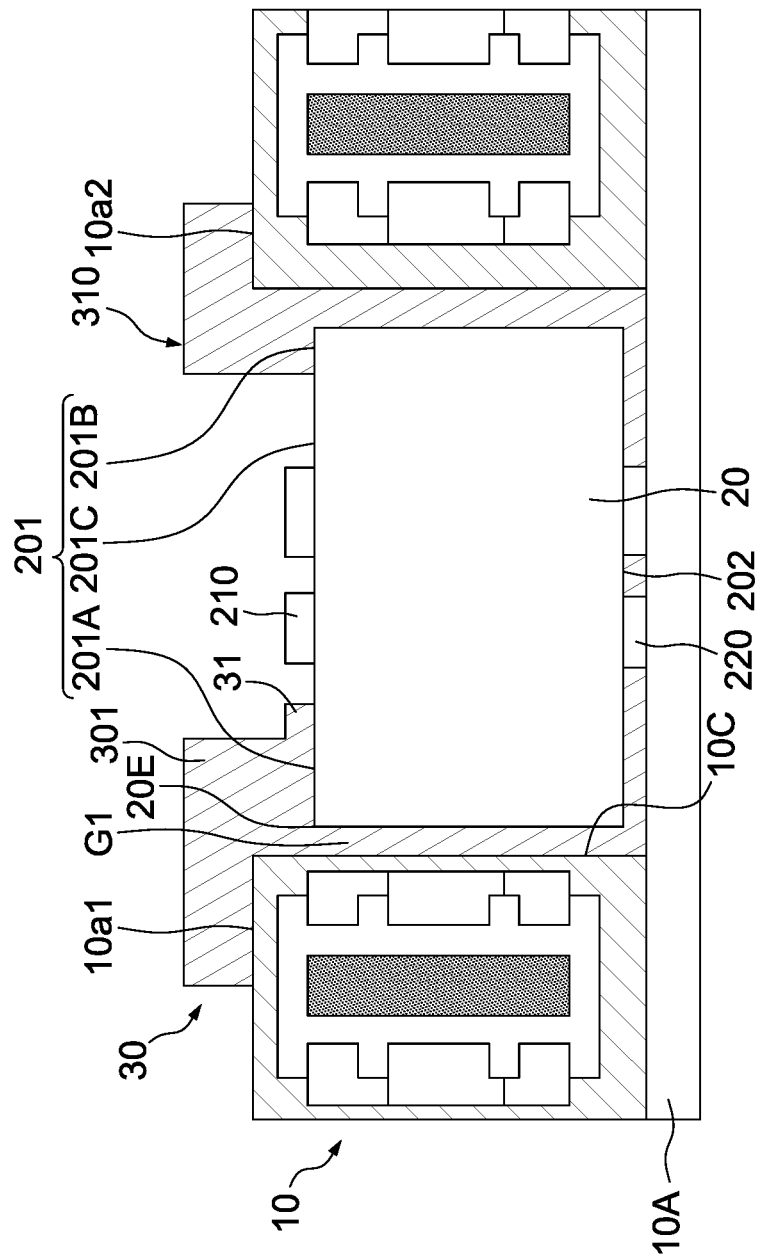

Referring to FIG. 4D, the fixture 80 may be removed. As such, the semiconductor substrate structure 2 illustrated in FIGS. 2A-2B is formed.

Figure 4E:
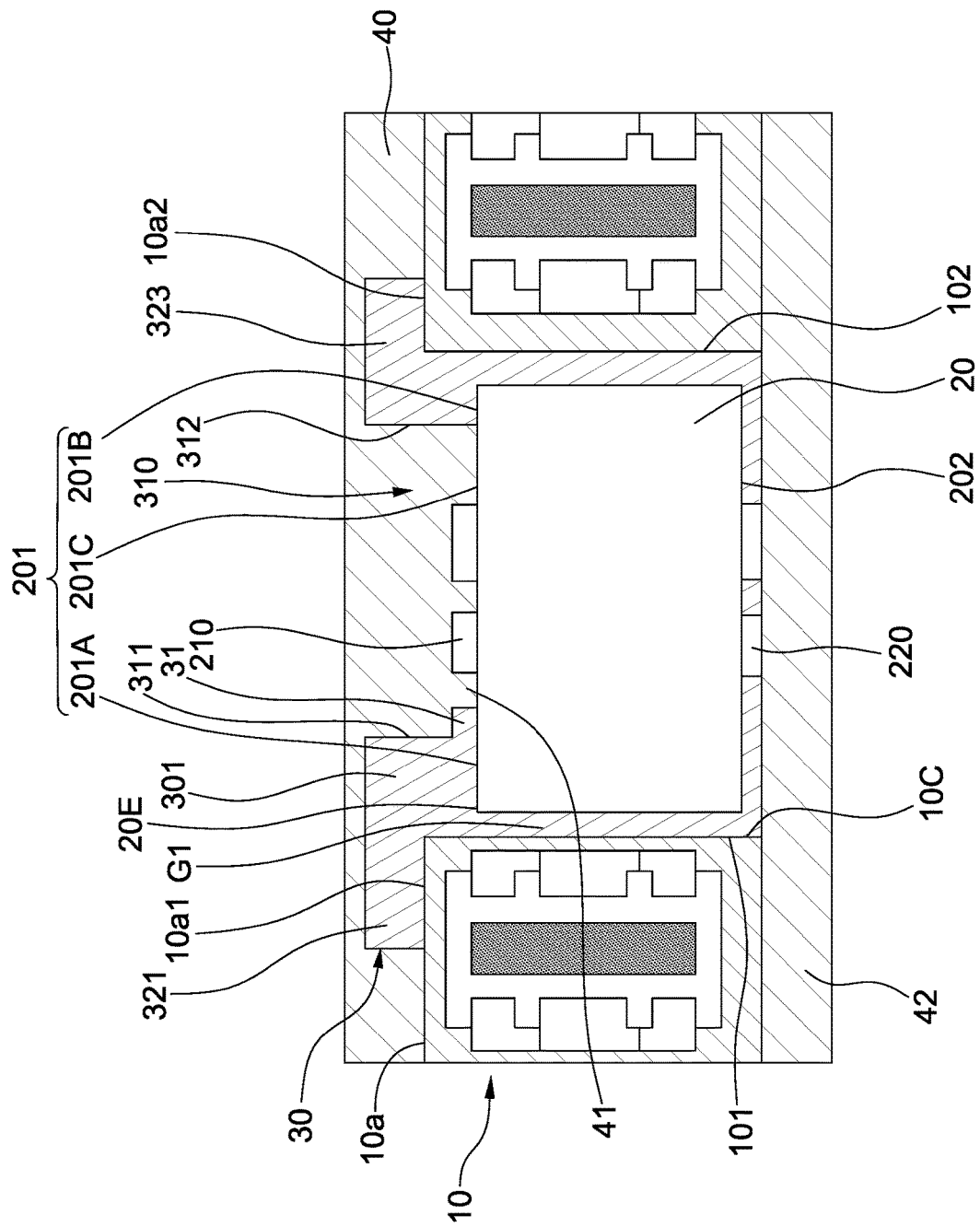

Referring to FIG. 4E, the carrier 10A may be removed, and dielectric layers 40 and 42 may be formed on the upper surface and the bottom surface of the structure shown in FIG. 4D, respectively. In some embodiments, the dielectric layers 40 and 42 may be formed by lamination.

Figure 4F:
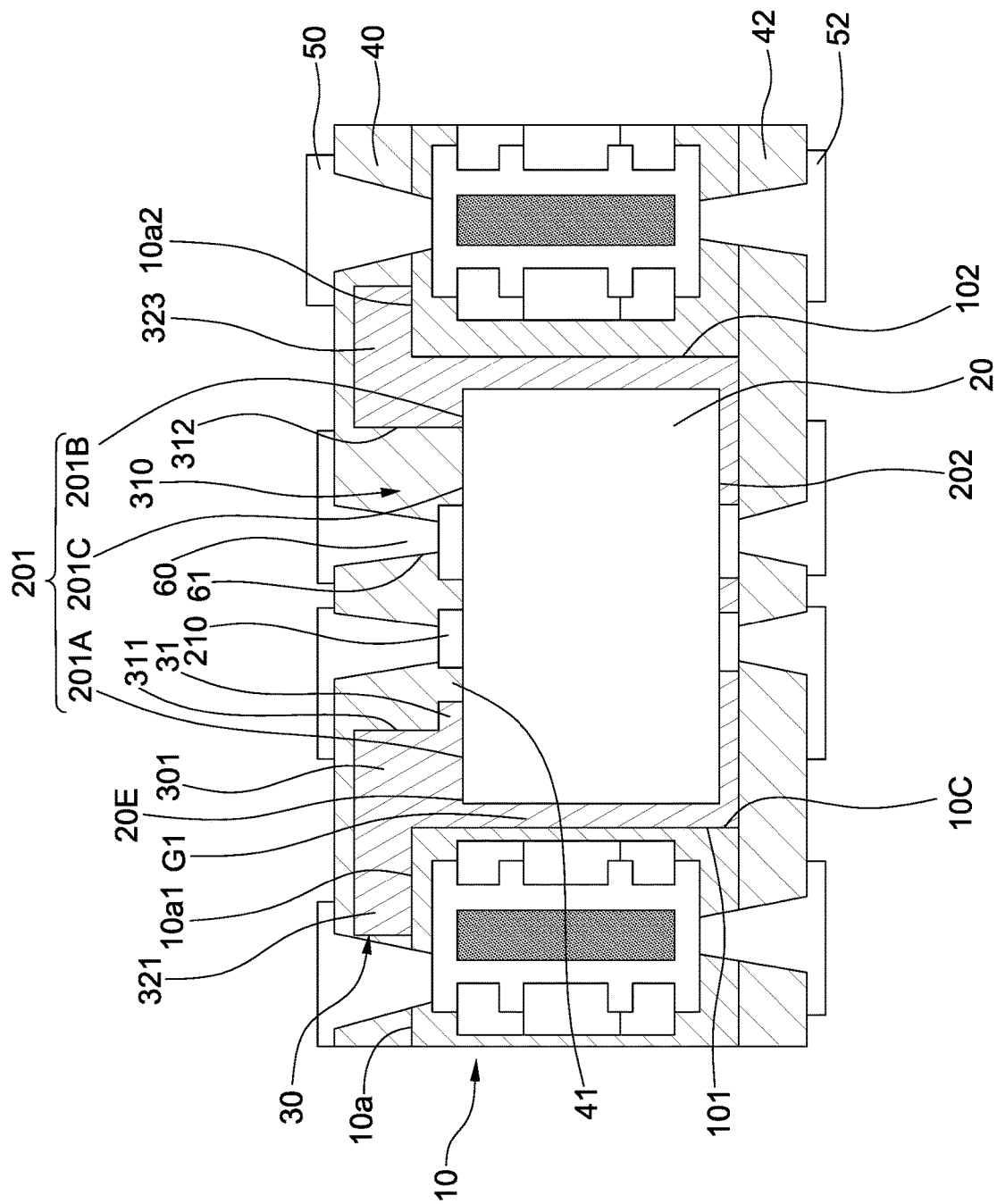

Referring to FIG. 4F, the dielectric layers 40 and 42 may be patterned to form openings or via holes, through vias 60 and 62 may be formed in the openings or via holes, and sub-layers of conductive elements 50 and 52 may be formed on the dielectric layers 40 and 42, respectively, to electrically connect to the electronic device 20 through the through vias 60 and 62. Next, referring to FIG. 3B, dielectric layers 51 and 53 may be formed on the conductive elements 50 and 52, respectively, additional sub-layers of the conductive elements 50 and 52 may be formed on the dielectric layers 51 and 53, respectively, and solder masks 70 and 72 may be formed over the conductive elements 50 and 52 to define openings for solder balls to be disposed on and electrically connected to the conductive elements 50 and 52, respectively. As such, the semiconductor substrate structure 3B illustrated in FIG. 3B is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor substrate structure, comprising:
   a substrate defining a cavity;
   an electronic device disposed in the cavity;
   a filling material encapsulating the electronic device;
   a dielectric layer disposed over the electronic device; and
   a first via in the dielectric layer, wherein the first via is horizontally overlapping and spaced apart from the filling material,
   wherein the filling material comprises a first portion horizontally overlapping the electronic device and a second portion under the electronic device, and a width of the first portion is greater than a thickness of the second portion in a cross-sectional view perspective.

2. The semiconductor substrate structure of claim 1, wherein the first via is disposed over the electronic device, and an elevation of a bottom surface of the first via facing the electronic device is lower than an elevation of a top surface of the filling material facing away the electronic device with respect to a top surface of the electronic device.

3. The semiconductor substrate structure of claim 2, wherein the first via has a top surface opposite to the bottom surface of the first via, and an elevation of the top surface of the first via is higher than the elevation of the top surface of the filling material with respect to the top surface of the electronic device.

4. The semiconductor substrate structure of claim 1, wherein the filling material further comprises a third portion horizontally overlapping the electronic device and opposite to the first portion, and a width of the third portion is different from the width of the first portion in the cross-sectional view perspective.

5. The semiconductor substrate structure of claim 4, wherein the width of the first portion of the filling material is less than a width of a bottom surface of the first via.

6. The semiconductor substrate structure of claim 1, wherein the first portion of the filling material contacts a first region of a top surface of the electronic device and the second portion of the filling material contacts a second region of the top surface of the electronic device, and a width of the first region is different from a width of the second region in the cross-sectional view perspective.

7. The semiconductor substrate structure of claim 6, wherein a lateral surface of the first portion of the filling material comprises a curved surface.

8. The semiconductor substrate structure of claim 7, wherein at least a portion of a top surface of the substrate is exposed by the filling material.

9. The semiconductor substrate structure of claim 1, wherein a bottom surface of the filling material is substantially co-level with a bottom surface of the substrate.

10. The semiconductor substrate structure of claim 9, wherein the substrate has a top surface opposite to the bottom surface, the filling material has a top surface opposite to the bottom surface, and an elevation of a portion of the top surface of the filling material is not higher than an elevation of the top surface of the substrate with respect to the bottom surface of the substrate.

11. A semiconductor substrate structure, comprising:
a substrate defining a cavity;
an electronic device disposed in the cavity;
a filling material encapsulating the electronic device;
a first conductive pad disposed adjacent to a top surface of the electronic device and spaced apart from the filling material;
a second conductive pad disposed adjacent to the top surface of the electronic device and between the first conductive pad and the filling material, wherein a space between the first conductive pad and the second conductive pad is exposed by the filling material; and
a dielectric layer disposed over the electronic device and extending into the space,
wherein an elevation of a top surface of the dielectric layer is higher than an elevation of a top surface of the filling material with respect to the top surface of the electronic device, and the dielectric layer contacts the top surface of the electronic device.

12. The semiconductor substrate structure of claim 11, wherein a lateral surface of the dielectric layer is recessed with respect to an adjacent lateral surface of the electronic device.

13. A semiconductor substrate structure, comprising:
a substrate defining a cavity;
an electronic device disposed in the cavity;
a filling material disposed in the cavity;
a first via in the substrate, wherein the filling material comprises a lower portion under a lower surface of the electronic device, and the first via is free from horizontally overlapping the lower portion; and
a second via in the substrate, wherein the second via comprises a portion horizontally overlapping the lower portion of the filling material, and the portion of the second via tapers in a direction from the lower surface of the electronic device toward an upper surface of the electronic device opposite to the lower surface of the electronic device.

14. The semiconductor substrate structure of claim 13, wherein a bottom surface of the lower portion of the filling material is substantially co-level with a bottom surface of the substrate.

15. The semiconductor substrate structure of claim 13, wherein a thickness of the lower portion of the filling material is less than a horizontal distance between a lateral sidewall of the electronic device and an inner sidewall of the cavity of the substrate.

* * * * *